United States Patent
Katsuyama et al.

[11] Patent Number: 6,112,070
[45] Date of Patent: Aug. 29, 2000

[54] HIGH FREQUENCY RECEIVING CIRCUIT FOR MOBILE COMMUNICATION APPARATUS

[75] Inventors: Tsutomu Katsuyama; Hiroshi Andou, both of Tokyo, Japan

[73] Assignee: Oki Electric Industry Co., Ltd., Tokyo, Japan

[21] Appl. No.: 08/837,095

[22] Filed: Apr. 14, 1997

[30] Foreign Application Priority Data

Apr. 23, 1996 [JP] Japan ..................................... 8-101033

[51] Int. Cl.[7] ...................................................... H04B 1/10
[52] U.S. Cl. ........................................... 455/307; 455/334
[58] Field of Search ..................................... 455/296, 334, 455/307, 308, 318, 210, 266, 340

[56] References Cited

U.S. PATENT DOCUMENTS 5,822,687  10/1998  Bickley et al. .......................... 455/266
5,963,856  10/1999  Kim ......................................... 455/307

Primary Examiner—Reinhard J. Eisenzopf
Assistant Examiner—Marsha D. Banks-Harold
Attorney, Agent, or Firm—Jones Volentine, LLP

[57] ABSTRACT

A receiving wave containing a desired signal and received through an antenna is inputted to an interstage band-pass filter 4 after the component outside a receiving band of the receiving wave has been attenuated by a receiving band-pass filter 2a. A phase locked loop circuit 9 outputs a frequency control voltage corresponding to a selected channel to a voltage control oscillator 8 and also outputs this frequency control voltage to an interstage band-pass filter 4 as a band control voltage thereof. The voltage control oscillator 8 generates a local carrier wave in response to the frequency control voltage. The interstage variable band-pass filter 4 has a passing band width which is a little wider than channel band width and varies its passing band in response to the band control voltage so as to include the selected channel, thereby attenuating the component outside the passing band of the receiving wave inputted from the low noise amplifier 3 and then inputs the receiving wave to a mixer 5. Accordingly, if a frequency which causes a single-signal interference is located in the receiving band apart from the selected channel frequency by a half of the intermediate frequency, the interference wave of this frequency can be attenuated.

15 Claims, 6 Drawing Sheets

F I G. 1
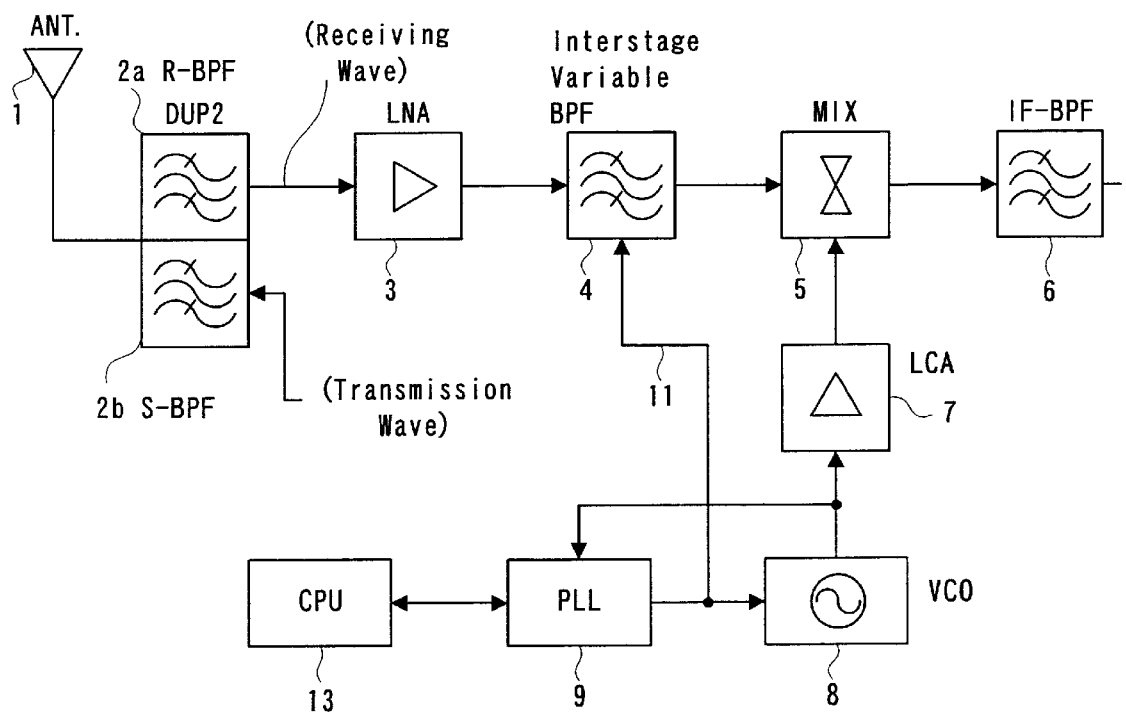

a: Receiving Band
b: Passing band of Interstage Variable BPF
c: Channel Band
d: Passing Band of IF-BPF
$f_{ch}$: Selective Channel Frequency
$f_i$: Intermediate Frequency
$f_L$: Local Oscillation Frequency
$f_u$: $f_{ch} + f_i/2$ Relation of Bands in First Embodiment

6,112,070

HIGH FREQUENCY RECEIVING CIRCUIT FOR MOBILE COMMUNICATION APPARATUS

BACKGROUND OF THE INVENTION

This invention relates to a high frequency receiving circuit for use in a mobile communication apparatus, and more particularly relates to a high frequency receiving circuit for use in a mobile telephone employing the CDDM (Code Division Multiple Access) system, for instance a cellular mobile telephone (IS95A Spec.; 800 MHz) and a portable or pocketable mobile telephone (PN-3385 Spec.; 1.9 GHz).

Heretofore, as show in FIG. 8, the high frequency receiving circuit of this kind is provided with an antenna (ANT) 51, a duplexer (DUP) 52, an amplifier with low noise (LNA) 53, an interstage band-pass filter (IS-BPF) 54, a mixer (MIX) 55, an intermediate frequency band-pass filter (IF-BPF) 56, a local amplifier (LCA) 57, a voltage control oscillator (VCO) 58, and a phase locked loop circuit (PLL) 59.

A receiving band-pass filter (R-BPF) 52a of the duplexer 52 and the interstage band-pass filter 54 are band-pass filters commonly having a passing band equal to the receiving band of a station's own. These band-pass filters act to prevent the transmission wave from their own station and the unnecessary receiving wave coming thereto from being inputted to the low noise amplifier 53 and the mixer 55, thereby checking deterioration in the receiving sensitivity and occurrence of the interference. Main characteristics required to both of the receiving band-pass filter 52a and the interstage band-pass fillter 54, are an insertion loss characteristic within the passing band and an attenuation characteristic outside the passing band. These characteristics will be determined totally taking account of the specification of the receiver.

The intermediate band-pass filter 56 is a band-pass filter which determines a channel band characteristic. The characteristic required to this band-pass filter 56 is to keep a constant phase within the passing band and to have the high attenuation characteristic outside the same. In order to realize such a characteristic, there is used a band-pass filter of the interdigital system. The center frequency of the band-pass filter of the interdigital system is generally set to a value of 70 through 110 MHz in view of its performance and price as well.

For instance, in the high frequency receiving circuit of the single conversion type shown in FIG. 8, the center frequency of the intermediate frequency band-pass filter 56 becomes the intermediate frequency, of which value is set to a value between 70 and 110 MHz. In case of the circuit in FIG. 8, the intermediate frequency is set to a value of 85.38 MHz.

However, the prior art high frequency receiving circuit as mentioned above, has often experienced such a problem that when an interference wave with a specific frequency is intermixed with the receiving wave, an interference that is so-called single-signal interference and/or intermodulation interference is caused in the range of the intermediate frequency.

The single-signal interference is a phenomenon which occurs when an interference wave with a frequency (fu) is intermixed with a receiving wave to be inputted to the mixer 55. The frequency (fu) is expressed as follows:

$$fu = fch \pm (\tfrac{1}{2})fi$$
$$((+) \text{ when } fch < fL \text{ and } (-) \text{ when } fch > fL)$$

where fch: receiving frequency (the center frequency of a selected channel),
fi: intermediate frequency, and
fL: local oscillation frequency of the voltage control oscillator 58.

Such interference wave is mixed with the local carrier wave in the mixer 55 to generate an interference signal in the range of the intermediate frequency.

On the other hand, the intermodulation interference is a phenomenon which takes place when a plurality of interference waves having a frequency apart from the receiving frequency fch of the selected channel at an equal interval, for instance two interference waves having frequencies of fch+1 MHz and fch+2 MHz respectively, are intermixed with the receiving wave to be inputted to the mixer 55. Such interference waves cause interference signals in the position of the receiving frequency or the intermediate frequency owing to intermodulation in the low noise amplifier and the mixer 55.

A lot of proposals have been made so far in order to prevent generation of such interference signals. However, according to the PN-3385 standard, the receiving band width is widely set to about 60 MHz while the intermediate frequency is set on such a lower side as 85.38 MHz, and the frequency of the above interference wave resides within the receiving band, so that it is difficult to attenuate the interference wave by means of the receiving band-pass filter 52a or the interstage band-pass filter 54. As to the endurance characteristic against interference, a very high level is requested according to the PN-3385, for instance 71 dB as the endurance quantity against the single-signal interference and 58 dB as the endurance quantity against the intermodulation interference. Thus, such technical requirement could hardly be satisfied for the same reason. The endurance quantity against the interference is defined as a level of the interference signal which causes deterioration in the receiving sensitivity. For instance, the endurance quantity against the single-signal interference being 71 dB means that the receiving sensitivity starts its deterioration if the single-signal interference wave, of which the level is at least 71 dB higher than the level of a desired signal (i.e. signal sent by a caller side and to be received by an addressed receiver) is intermixed through the antenna 1.

As a countermeasure for improving the endurance characteristic against interference, it might be considered to use a double balanced mixer 55 for suppressing generation of the interference signal. However, this would not work to adequately satisfy the above-mentioned endurance characteristic against interference.

Also, as a way for improving the endurance characteristic against the single-signal interference that, as shown in FIG. 9, it might be proposed to provide a high frequency receiving circuit of the double conversion type, in which the center frequency of the passing band of the 1st intermediate frequency band-pass filter (1st IF-BPF) 61 is increased to 210.38 MHz while the same of the 2nd intermediate frequency band-pass filter (2nd IF-BPF) 63 is set to 85.38 MHz. In the circuit arrangement like this, the interference wave frequency fu comes to be outside the receiving band, and the interference wave with the frequency fu is made to attenuate between the receiving band-pass filter 52a and the interstage band-pass filter 54 while the interference wave existing in the receiving band is made to attenuate between the 1st intermediate band-pass filter 61 and the 2nd intermediate frequency band-pass filter 63. As for the endurance quantity against the interference, however, in order to fully satisfy the above-mentioned standard by relying on the circuit as arranged above, the 2nd mixer (2nd MIX) 62 would require another countermeasure against the interference wave, for instance making it be of the double balance type. Consequently, this would result in presentation of additional problems such as increase in the number of circuit constituents and in the operational current consumption.

Accordingly, an object of the invention is to provide a novel and improved high frequency receiving circuit for use in a mobile communication apparatus having an excellent endurance characteristic against interference, by which the influence of the interference wave having a predetermine frequency can be minimized even if its intermixing happens.

Another object of the invention is to provide a novel and improved high frequency receiving circuit for use in a mobile communication apparatus which has an excellent endurance characteristic against the single-signal interference as well as against the intermodulation interference, and meets various strict standards, especially the IS95A Standard and the PN-3385 Standard.

Still another object of the invention is provide a novel and improved high frequency receiving circuit for use in a mobile communication apparatus which may be simply designed without modifying the prior art high frequency receiving circuit to a great extent, thus being capable of manufacturing it at a low cost.

Still another object of the invention is provide a novel and improved communication apparatus, of which the endurance characteristic against interference may be improved without increasing the operational current consumption comparing with the prior art high frequency receiving circuit, thus being preferably and suitably applicable to a portable telephone requiring less power consumption.

SUMMARY OF THE INVENTION

In order to achieve the above-mentioned objects, the invention provides a high frequency receiving circuit for a mobile and/or portable communication apparatus which receives a desired signal within the band of a channel selected from a plurality of channels which are divided within a receiving band by means of frequency division based on selective channel information. This high frequency receiving circuit is provided with a 1st band limiter, a 2nd band limiter, a local carrier wave generator, and a frequency converter.

The 1st band limiter attenuates the component outside the receiving band of a receiving wave received through an antenna by a predetermined attenuation value, with respect to the component within the receiving band.

The 2nd band limiter varies its passing band width to include the selected channel band and attenuates the component outside said passing band of the receiving wave outputted from the 1st band limiter by a predetermined attenuation value, with respect to the component within said passing band.

The local carrier wave generator generates, based on the selective channel information, a local carrier wave, of which the frequency is different from the center frequency of the selected channel by an intermediate frequency as set in advance.

Furthermore, a frequency converter intermixes the receiving wave outputted by the 2nd band limiter with the local carrier wave outputted from the local carrier wave generator, thereby converting the center frequency of the desired signal contained in the receiving wave into the intermediate frequency.

BRIEF DESCRIPTION OF THE DRAWINGS

FIG. 1 is a circuit block diagram illustrating a high frequency receiving circuit according to the first embodiment of the invention;

DESCRIPTION OF THE PREFERRED EMBODIMENT

The invention will now be described in detail by way of an exemplary and preferred embodiment of a high frequency receiving circuit for use in a mobile communication apparatus according to the invention, with reference to the accompanying drawings.

First Embodiment

Figure 2:
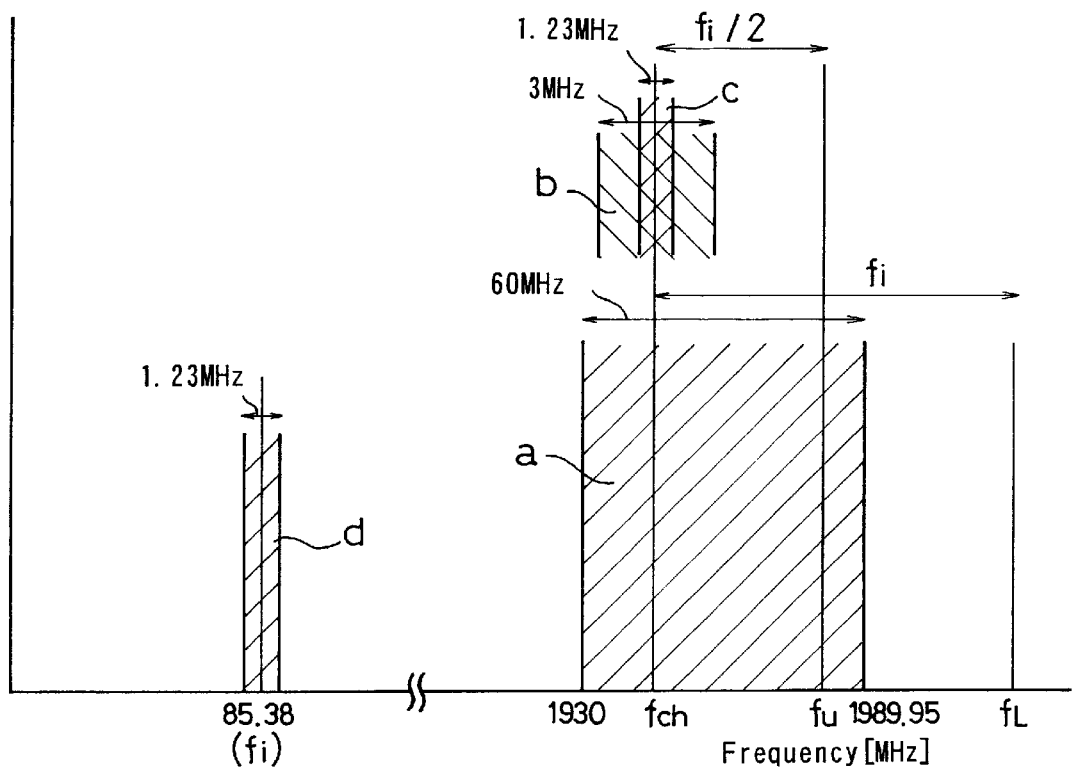
FIG. 2 is a graph for explaining the frequency bands in the first embodiment shown in FIG. 1.

FIG. 1 is a circuit block diagram illustrating a high frequency receiving circuit according to the 1st embodiment of the invention. This high frequency receiving circuit can be applied to a mobile telephone (not shown) conforming to the PN-3385 Standard and is arranged to receive a signal in a channel band which is selected from a plurality of channel bands divided by frequency division in the receiving band. At this time, according to the PN-3385 Standard, the receiving band is stipulated as 1930 to 1989.95 MHz while the transmission band is stipulated as 1850 to 1909.95 MHz. Consequently, the receiving and transmission bands evenly have a band width of approximately 60 MHz. The channel band width is also stipulated as 1.23 MHz. FIG. 2 is a graph for explaining the relationship among respective bands relating to the 1st embodiment shown in FIG. 1.

The high frequency receiving circuit shown in FIG. 1 includes an antenna (ANT) 1, a duplexer (DUP) 2, a low noise amplifier (LNA) 3, an interstage variable band-pass filter (variable IS-BPF) 4, a mixer (MIX) 5, an intermediate frequency band-pass filter (IF-BPF) 6, a local amplifier (LCA) 7, a voltage control oscillator (VCO) 8, and a phase locked loop circuit (PLL) 9.

The duplexer 2 includes a receiving band-pass filter (R-BPF) 2a and a transmission band-pass filter (S-BPF) 2b. The passing band of the filter 2a is the receiving band (1930 to 1989.95 MHz, [a] shown in FIG. 2) while the same of the filter 2b is the transmission band (1850 to 1909.95 MHz), and both band-pass filters are connected with the antenna 1. The receiving band-pass filter 2a attenuates the component outside the receiving band of the input receiving wave by a predetermined value. The transmission band-pass filter 2b attenuates the component outside transmission band of the inputted transmission wave by a predetermined value and then, sends the transmission wave to the antenna 1. The low noise amplifier 3 amplifies the receiving wave outputted from the receiving band-pass filter 2a by a predetermined value. The receiving band-pass filter 2a and the low noise amplifier 3 constitute a 1st band limiter, which attenuates the component outside the receiving band of the receiving wave as received by the antenna 1 by a predetermined value with respect to the component within the receiving band.

The voltage control oscillator 8 outputs a local carrier wave having a frequency (local oscillation frequency), which corresponds to the direct frequency control voltage inputted by the phase locked loop circuit 9, to the local amplifier 7 and the phase locked loop circuit as well. The local oscillation frequency of the voltage control oscillator 8 rises up together with increase in the voltage of the frequency control voltage. The local amplifier 7 amplifies the local carrier wave and sends it to the mixer 5. The phase locked loop circuit 9 monitors the frequency of the local carrier wave inputted from the voltage control oscillator 8, and controls the local oscillation frequency of the voltage control oscillator 8 by varying the frequency control voltage based on the selective channel information inputted by the central processing unit (CPU) 13, in such a manner that it becomes a frequency which is different from the center frequency of the selected channel by a value of the intermediate frequency as set in advance. In this embodiment, the local oscillation frequency is controlled so as to become larger than the center frequency of the selected channel by a value of the intermediate frequency, for instance 85.38 MHz. This frequency control voltage is also inputted to the interstage variable band-pass filter 4 through a control line 11. Accordingly, the voltage control oscillator 8 and the phase locked loop circuit 9 constitutes a local carrier wave generator which generates, based on the selective channel information, the local carrier wave of which the frequency is different from the center frequency of the selected channel by the intermediate frequency (85.38 MHz), and also generates a band control voltage.

The interstage variable band-pass filter 4 functions as a 2nd band limiter and has a passing band width, which is wider than the channel band width (1.23 MHz, [c] of FIG. 2) but is narrower than the receiving band width (60 MHz). Also, this band-pass filter 4 may change the above-mentioned upper and lower limits of the passing band to cover the selected channel band in response to the band control voltage inputted from the phase locked loop circuit 9, thereby attenuating the component outside the passing band of the receiving wave inputted from the low noise amplifier 3 by a predetermined value with respect to the component within the passing band. For instance, this attenuation quantity may be set to 30 dB. Also, the passing band may be set to 3 MHz as shown [c] in FIG. 2 by taking account of performance, accuracy, etc. of respective circuit constituents. The passing band of this interstage variable band-pass filter 4 is preferably made a little wider than the channel band.

Figure 3:
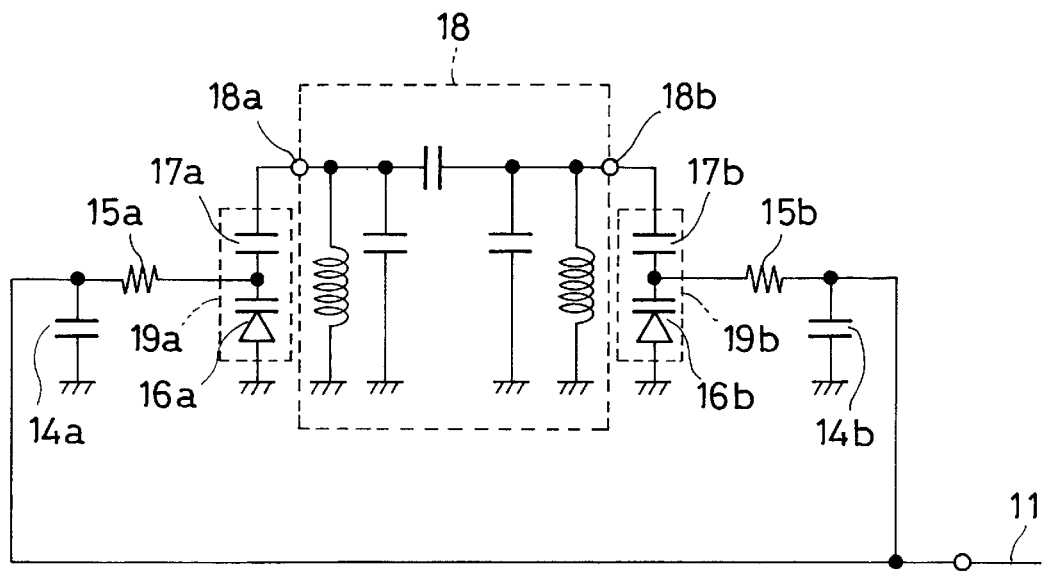
FIG. 3 shows a circuit diagram of an interstage band-pass filter in the first embodiment of FIG. 1.

FIG. 3 is a circuit diagram of the interstage variable band-pass filter 4. Referring to this figure, the interstage variable band-pass filter 4 includes condensers 14a, 14b, 17a, 17b, resistances 15a, 15b, variable capacitor diodes 16a, 16b, and a fixed band-pass filter 18.

The input terminal 18a of the fixed band-pass filter 18 is connected with the output terminal of the low noise amplifier 3 while the output terminal 18b of it is connected with the mixer 5. One terminal of the coupling condenser 17a is connected with the input terminal 18a while the other terminal of it is connected with the cathode terminal of the variable capacitor diode 16a, of which the anode is grounded. Likewise, One terminal of the coupling condenser 17b is connected with the input terminal 18b while the other terminal of it is connected with the cathode terminal of the variable capacitor diode 16b, of which the anode is grounded. One end of the resistance 15a is connected with the cathode terminal of the variable capacitor diode 16a while the other terminal of it is connected is grounded through the condenser 14a and is also connected with the control line 11. Likewise, One end of the resistance 15b is connected with the cathode terminal of the variable capacitor diode 16b while the other terminal of it is connected is grounded through the condenser 14b and is also connected with the control line 11. Coupling condensers 17a, 17b are used for blocking the direct current flow to the fixed band-pass filter 18 while resistances 15a, 15b and condensers 14a, 14b are used for blocking the high frequency leaking from the fixed band-pass filter 18 to the control line 11. Capacitance of respective variable capacitor diodes 16a, 16b decreases when the voltage reversely applied across their anode and cathode is increased.

A band control capacitance 19a as a series combination capacitance formed of the variable capacitor diode 16a and the coupling condenser 17a is connected in series with the input terminal 18a of the fixed band-pass filter 18. Likewise, another band control capacitance 19b as a series combination capacitance formed of the variable capacitor diode 16b and the coupling condenser 17b is connected in series with the input terminal 18b of the fixed band-pass filter 18. Consequently, the passing band of the interstage variable band-pass filter 4 is determined by the passing band characteristic of the fixed band-pass filter 18 and the band control capacitance 19a connected thereto while the passing band width of the interstage variable band-pass filter 4 is determined depending only on the passing band characteristic of the fixed band-pass filter 18. Accordingly, the capacitance of variable capacitor diodes 16a, 16b varies if a voltage (band control voltage) applied to its cathode varies. As a result of this, the band control capacitances 19a, 19b are varied, thus making it possible to vary the passing band of the interstage variable band-pass filter 4. As the band control capacitances 19a, 19b become smaller, the passing band of the interstage variable band-pass filter 4 shifts to the high frequency side. The changing rate of the band control capacitances 19a, 19b to the change of the frequency control voltage i.e. the changing rate of the passing band of the interstage variable band-pass filter 4 to the change of the frequency control voltage can be adjusted by adjusting the capacitance values of coupling condensers 17a, 17b.

Now, again referring to FIG. 1, the mixer 5 mixes the receiving wave inputted from the interstage variable band-pass filter 4 with the local carrier wave inputted from the local amplifier 7 and generates a mixed wave of the receiving wave and the local carrier wave. This receiving wave includes a desired signal sent from a calling side through the base station. On the other hand, the mixed wave includes the above-mentioned desired signal (referred to as desired intermediate frequency signal hereinafter) which is produced by converting the center frequency of the desired signal to the intermediate frequency (85.38 MHz). The mixer 5 would work well if it can secure an endurance quantity of 40 dB or so against the interference. Therefore, the mixer 5 may be arranged as a simple and low cost circuit of the single type using FETs and bipolar transistors, so that there is no need for employing any special and complex circuit such as a double balanced type circuit. The mixing endurance quantity against the interference is defined as an input level of the interference signal to the mixer 5, which causes the receiving sensitivity deterioration in the output from the mixer 5 i.e. the desired intermediate frequency signal. For instance, the mixing endurance quantity of 40 dB means that deterioration of the receiving sensitivity is caused if there is occurred intermixing of the interference wave at a the level which is at least 40 dB higher than the level of a desired signal (sent from a calling side to an addressed receiver). The intermediate frequency band-pass filter 6 has a passing band which places its band center at the intermediate frequency (85.38 MHz) and has the channel width (1.23 MHz) ([d] of FIG. 2), and selectively allows the desired intermediate frequency signal to pass therethrough attenuating the component of the intermixed wave which is inputted through the mixer 5 and is outside the passing band. Combination of this mixer 5 and the intermediate frequency band-pass filter 6 results in a frequency convertor, which mixes the receiving wave from the interstage variable band-pass filter 4 with the local carrier wave from the local amplifier 7, thereby converting the center frequency of the desired signal included in the receiving wave to the intermediate frequency.

Generally, in case of trying to make the passing band of the band-pass filter variable by adopting the variable capacitor diode, the insertion loss of the band-pass filter is increased owing to the decease in Q-value by the variable capacitance diode, thereby the endurance characteristic being improved. However, increase in the insertion loss causes deterioration in the noise figure. For this reason, it is not recommendable to use the variable band-pass filter as the receiving band-pass filter 2a of the duplexer 2. In case of using the variable band-pass filter as the interstage band-pass filter as in the case of FIG. 1, the noise figure may be compensated by means of increasing the gain of the low noise amplifier 3, so that the insertion loss of 5 dB or so by the interstage variable band-pass filter would be in the allowable range even if it is caused.

The operation of the high frequency receiving circuit shown in FIG. 1 will now be described in the following. A receiving wave caught by the antenna 1 is inputted to the receiving band-pass filter 2a of the duplex 2, which in turn selectively attenuates the component outside the receiving band (unnecessary wave component like interference wave or the like). The receiving wave as processed above is amplified by the low noise amplifier 3 and is then inputted to the interstage variable band-pass filter 4.

The local oscillation frequency of the voltage control oscillator 8 is controlled by the frequency control voltage inputted from the phase locked loop circuit 9 in such a manner that it becomes larger than the center frequency of the selected channel by the intermediate frequency (85.38 MHz). The local carrier wave outputted by the voltage control oscillator 8 is amplified by the local amplifier 7 and is then inputted to the mixer 5. The above-mentioned frequency control voltage is also inputted to the interstage variable band-pass filter 4 through the control line 11, as a band control voltage.

Here, there will be explained about the change of the passing band of the interstage variable band-pass filter 4. The band control voltage outputted from the phase locked loop circuit 9 is applied to the cathode terminals of variable capacitors 16a, 16b through resistances 15a, 15b, respectively.

Now, assuming that the selected channel has shifted to the high frequency side, the phase locked loop circuit 9 raises the band control voltage (i.e. frequency control voltage) to make the local oscillation frequency higher. As a result of this, the capacitance of respective variable capacitor diodes 16a, 16b is made smaller, and the capacitance of respective band control capacitances 19a, 19b is also made smaller. Therefore, the passing band of the interstage variable band-pass filter 4 shifts to the high frequency side so as to include the selected channel. Contrary to this, assuming that the selected channel has shifted to the low frequency side, the band control voltage goes down so that the capacitance of the band control capacitances 19a, 19b becomes large. Therefore, the passing band of the interstage variable band-pass filter 4 shifts to the low frequency side so as to cover the selected channel.

Accordingly, the receiving wave outputted from the low noise amplifier 3 is inputted to the mixer 5 after the component outside the passing band has been selectively attenuated through the interstage variable band-pass filter 4 having a passing band of which the band width is 3 MHz including the selected channel.

The receiving wave inputted from the interstage variable band-pass filter 4 is mixed with the local carrier wave inputted from the local amplifier 7 in the mixer 5, and the mixed wave is sent to the intermediate frequency band-pass filter 6 having the passing band, of which the center frequency and the band width are 85.38 MHz and 1.23 MHz, respectively. Then, the component outside the passing band is attenuated in this band-pass filter 6, and the desired intermediate frequency signal is selectively allowed to pass therethrough.

As discussed above, in the embodiment in FIG. 1, the interstage variable band-pass filter 4 which can vary its passing band is used, so that unnecessary waves outside the passing band of this filter 4, for instance such a wave with a frequency fu causing the single-signal interference, can be attenuated to 30 dB, by setting the band width of the passing band a little wider (e.g. 3 MHz) than the channel band width (1.23 MHz) so as to include the channel band width, thus being able to improve the endurance characteristics against the single-signal interference and intermodulation interference. Accordingly, it is possible to secure the endurance quantity against interference of 70 dB in total if adding the mixing endurance quantity of 40 dB.

Furthermore, comparing to the prior art high frequency receiving circuit of the double conversion type, the 1st embodiment as mentioned above can contribute to reducing the number of circuit elements, lowering the operational current consumption, and making the circuit more compact. Still further, the frequency control voltage of the voltage control oscillator 8 can be used as the band control voltage of the interstage variable band-pass filter 4, so that there is no need for any control device to be newly prepared and it becomes possible to apply the band control voltage to the interstage variable band-pass filter 4 by means of a simple circuit arrangement.

Second Embodiment

Figure 4:
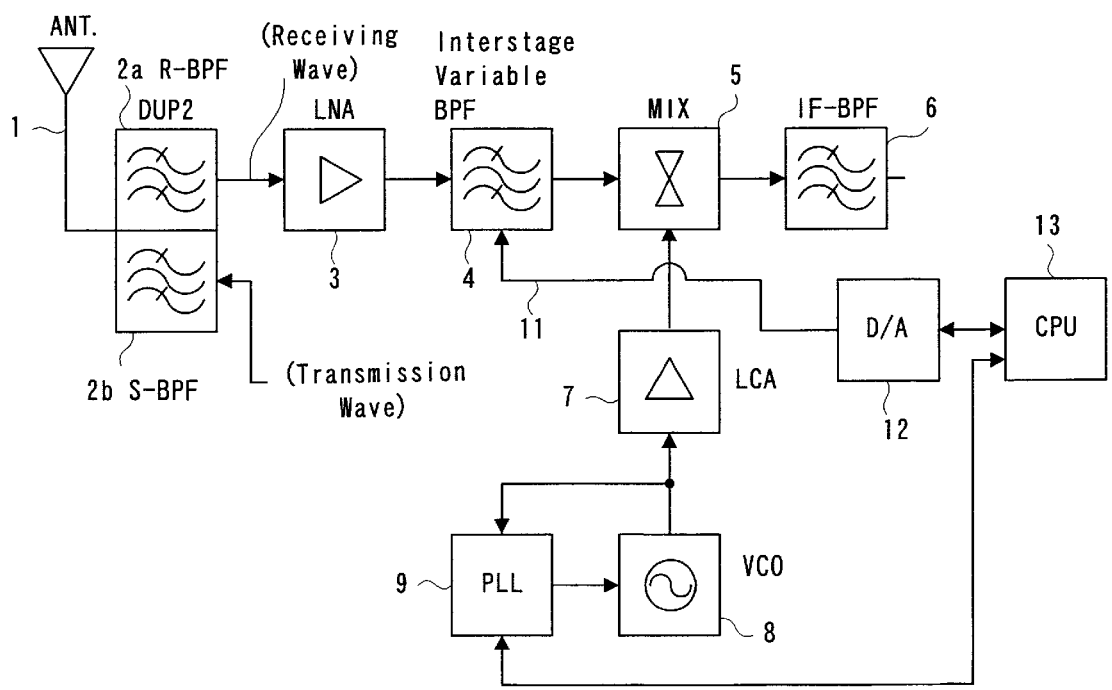
FIG. 4 is a circuit block diagram showing a high frequency receiving circuit according to the second embodiment of the invention.

FIG. 4 is a circuit block diagram of the high frequency receiving circuit embodying the invention. In the high frequency receiving circuit as shown in this figure, there is newly provided a D/A converter 12 in addition to the circuit arrangement shown in FIG. 1. This D/A converter is used for converting the selective channel information in the form of digital data to a analog voltage. In this embodiment, the analog voltage outputted from the D/A converter 12 is use as the band control voltage, so that the frequency control voltage from the phase locked loop circuit 9 is not used as the band control voltage. Thus, it should be noted that this D/A converter 12 works as a kind of controller.

In this case, the higher the center frequency of the channel to be selected becomes, the larger the data of the selective channel information which is inputted form CPU 13 to the D/A converter 12 become. Thus, the higher the center frequency of the channel to be selected becomes, the higher the band control voltage becomes, thus enabling the passing band of the interstage variable band-pass filter to shift to the high frequency side.

As mentioned above, according to the second embodiment of the invention, it becomes possible for the D/A converter to independently generate the band control voltage without using the frequency control voltage from the phase locked loop circuit as the band control voltage. Consequently, there is enlarged the degree of freedom in designing the interstage variable band-pass filter 4.

Third Embodiment

Figure 5:
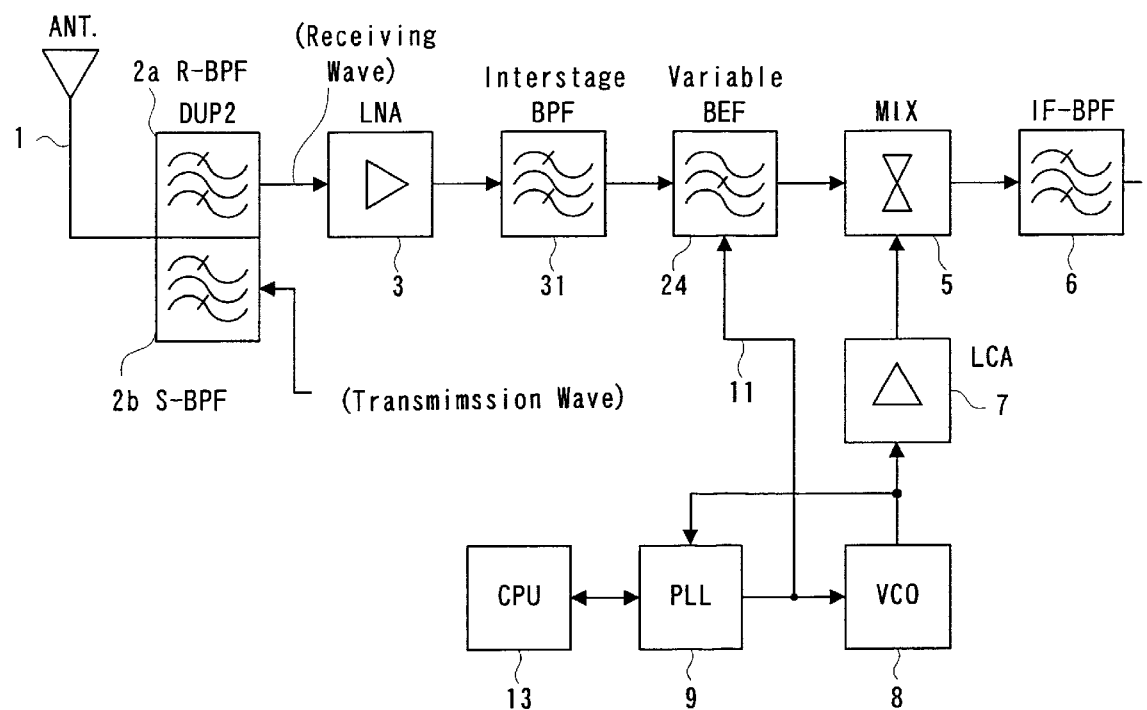
FIG. 5 is a circuit block diagram representing a high frequency receiving circuit according to the third embodiment of the invention.

FIG. 5 is a circuit block diagram representing the third embodiment of the high frequency receiving circuit according to the invention. In the high frequency receiving circuit in this figure, there are additionally provided a variable band-elimination filter (variable BEF) 24 and an interstage band-pass filter (interstage BPF) 31 in place of the interstage variable band-pass filter 4 in FIG. 1. In FIG. 5, it may be possible to change the position of the band-elimination filter 24 and the band-pass filter 31 with respect to the receiving wave flow.

The interstage band-pass filter 31 functions as the 4th band limiter with a passing band equal to the receiving band (1930 to 1989.95 MHz) and attenuates the component outside the receiving band in the receiving wave from the low noise amplifier 3 by a predetermined value. In this case, the attenuation quantity is set to 30 dB or so.

The variable band-elimination filter 24 functions as the 5th band limiter with a predetermined elimination band width, and varies the center frequency of the elimination band in response to the band control voltage from the phase locked loop circuit 9 so as to not include the selected channel band width but to include a frequency which is a half of the intermediate frequency (85.38 MHz) larger than the center frequency of the selected channel band, thereby attenuating the component inside the elimination band of the receiving wave inputted from the interstage band-pass filter 31 by a predetermined attenuation value with respect to the component outside the elimination band. In this case, the quantity of attenuation is set to 30 dB or so. In case the local oscillation frequency of the voltage control oscillator 8 is set to the lower side with respect to the center frequency of the selected channel, the above elimination band is controlled so as to include a frequency which is a half of the intermediate frequency (85.38 MHz) less than the center frequency of the selected channel band. The elimination band width may be set by taking account of the performance and accuracy of respective elements constituting the circuit.

Figure 6:
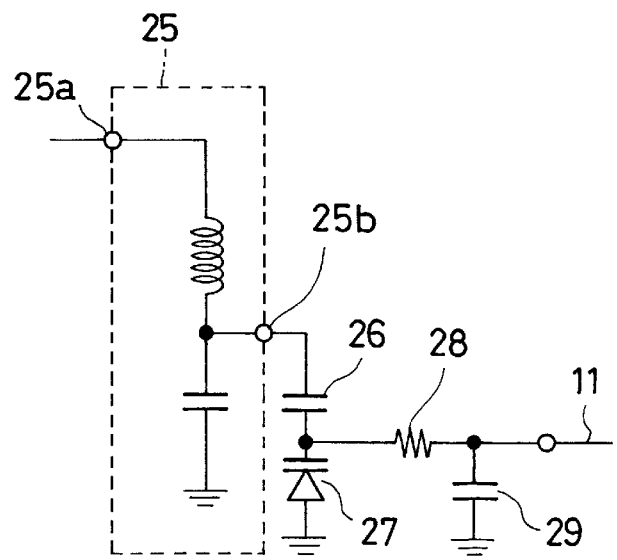
FIG. 6 is a circuit diagram of a variable band-pass filter in the third embodiment in FIG. 5.

FIG. 6 is a circuit diagram of the variable band-elimination filter 24, which includes condensers 26, 29, a resistance 28, a variable capacitor diode 27, and a fixed band-elimination filter 25.

The input terminal 25a of the fixed band-elimination filter 25 is connected with the output terminal of the interstage band-pass filter 31 in FIG. 5 while the output terminal 25b of the same is connected with the mixer 5 in the same figure. One end of the coupling condenser 26 is connected with the above output terminal 25b while the other end of it is connected with the cathode terminal of the variable capacitor diode 27, of which the anode terminal is grounded. One end of the coupling condenser 28 is connected with the cathode terminal of the variable capacitor diode 27 while the other end of it is grounded through the capacitance 29 and is also connected with a control line 11. The coupling condenser 26 acts to block the direct current intending to flow in the fixed band-elimination filter 25. The resistance 28 and the condenser 29 act to block the high frequency wave leaking out from the fixed band-elimination filter to the control line 11. The capacitance of the variable capacitor diode 27 becomes smaller in response to the increase in the reverse voltage applied between the anode and cathode thereof.

A band control capacitance 30 as a series combination capacitance formed of the variable capacitor diode 27 and the coupling condenser 26 is connected in series with the output terminal 25b of the fixed band-elimination filter 25. The elimination band of the variable band-elimination filter 24 is determined depending on the band elimination characteristic of the fixed band-elimination filter 25 and the band control capacitance 30 as well. The capacitance of variable capacitor diode 27 varies if a voltage (band control voltage) applied to its cathode is varied. Thus, the band control capacitance 30 is varied, thus enabling the elimination band of the variable band-elimination filter 24 to be varied. As the band control capacitance 30 becomes smaller, the elimination band of the variable band-elimination filter 24 shifts to the high frequency side.

The operation of the high frequency receiving circuit shown in FIG. 5 will now be described in the following. A receiving wave caught by the antenna 1 is inputted to the receiving band-pass filter 2a of the duplex 2, which in turn selectively attenuates the component of the receiving wave (unnecessary component like interference wave or the like) outside the receiving band. The receiving wave as processed above is amplified by the low noise amplifier 3 and is then inputted to the interstage variable band-pass filter 4.

The local oscillation frequency of the voltage control oscillator 8 is controlled by the frequency control voltage inputted from the phase locked loop circuit 9 in such a manner that it is larger than the center frequency of the selected channel by a frequency equal to the intermediate frequency (85.38 MHz). The local carrier wave outputted by the voltage control oscillator 8 is amplified by the local amplifier 7 and is then inputted to the mixer 5. The above-mentioned frequency control voltage is also inputted to the interstage variable band-pass filter 4 through the control line 11, as a band control voltage.

Here, there will be explained about the change of the elimination band of the variable band-elimination filter 24. The band control voltage outputted from the phase locked loop circuit 9 is applied to the cathode terminal of variable capacitor 27 through resistance 28. When the selected channel has shifted to the high frequency side, the phase locked loop circuit 9 raises the band control voltage (i.e. frequency control voltage) to make the local oscillation frequency larger. As a result of this, the capacitance of variable capacitor diode 27 is made smaller, thus the band control capacitance 30 being also made smaller. Therefore, the elimination band of the variable band-elimination filter 24 shifts to the high frequency side so as to include a frequency fu (=fch+fi/2) which causes the single-signal interference. Contrary to this, when the selected channel has shifted to the low frequency side, the band control voltage goes down so that the band control capacitance 30 becomes large.

Therefore, the elimination band of the variable band-elimination filter 4 shifts to the low frequency side so as to include the frequency fu.

Accordingly, the receiving wave outputted from the low noise amplifier 3 is inputted to the mixer 5 after the component inside the elimination band has been selectively attenuated through the variable band-elimination filter 24 having an elimination band including the frequency fu. The further operation of this embodiment is carried out in the same way as the operation of the high frequency receiving circuit as shown in FIG. 1.

As has been discussed above, in the third embodiment, there are used the interstage band-pass filter 31 using the receiving band as its fixed passing band and the variable band-elimination filter 24 which can vary its elimination band. The former can attenuate unnecessary wave outside the receiving band while the latter can change its elimination band to include the frequency fu. Consequently, even though the frequency fu resides in the receiving band, the interference wave with the frequency fu can be attenuated to 30 dB, thereby the endurance characteristic against the single-signal interference being improved. Accordingly, it is possible to secure the endurance quantity against the single-signal interference of 70 dB in total if adding the mixing endurance quantity of 40 dB of the mixer 5 to the above attenuation of 30 dB.

Furthermore, in case of the variable band-elimination filter 24, the small loss inside the passing band and the high attenuation outside the passing band are not required to be achieved at the same time, not like the variable band-pass filter 4 in FIG. 1, so that it becomes possible to enlarge the degree of freedom in designing the high frequency receiving circuit, to lower the loss inside the passing band and to suppress deterioration of the noise figure to the minimum level.

Still further, the variable band-elimination filter 24 may be controlled by using the band control voltage from the D/A converter 12 shown in FIG. 4.

Fourth Embodiment

Figure 7:
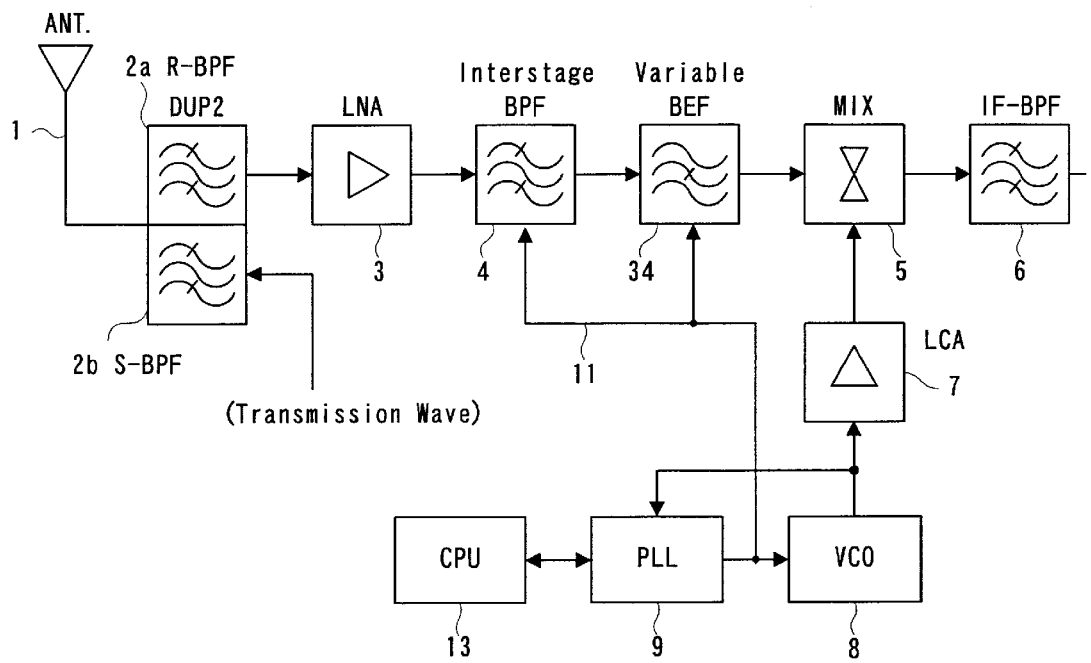
FIG. 7 is a circuit block diagram illustrating a high frequency receiving circuit according to the fourth embodiment of the invention.
Figure 8:
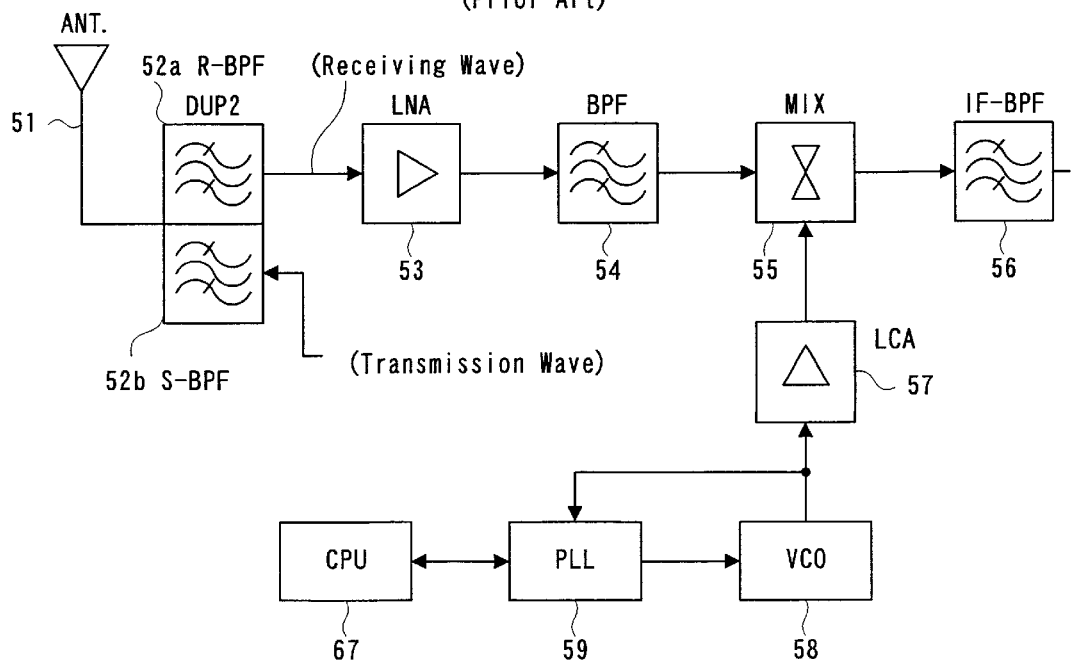
FIG. 8 is a circuit block diagram showing a prior art high frequency receiving circuit of the single conversion type.
Figure 9:
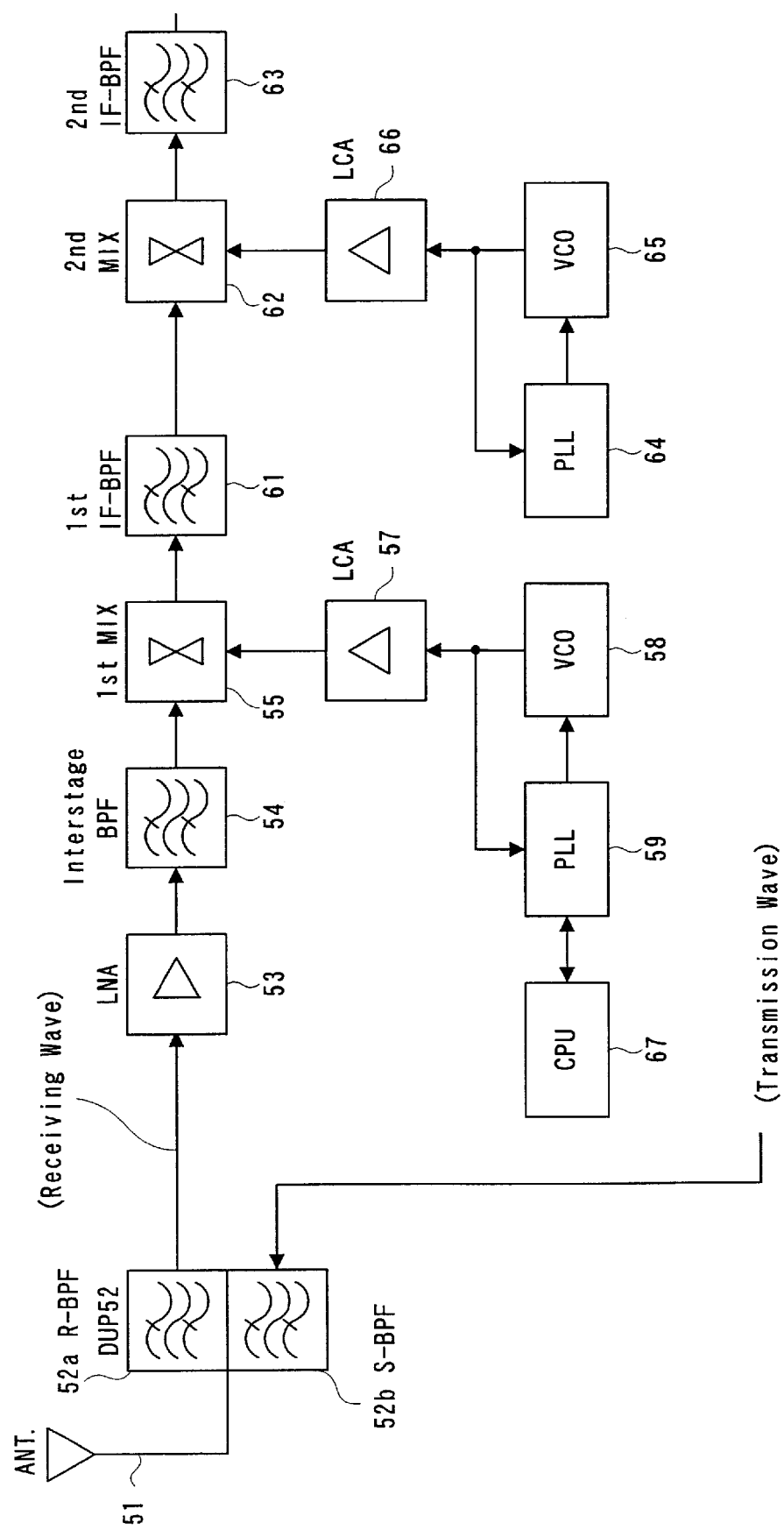
FIG. 9 is a circuit block diagram showing a prior art high frequency receiving circuit of the double conversion type.

FIG. 7 is a circuit block diagram illustrating the high frequency receiving circuit according to the fourth embodiment of the invention. This circuit employs an interstage band-pass filter which results from combination of the interstage variable band-pass filter 4 of FIG. 1 and the interstage variable band-elimination filter 34. These filters 4, 34 are respectively controlled by the band control voltage outputted from the phase locked loop circuit 9. Accordingly, in this embodiment, the interstage variable band-pass filter 4 functions as the 2nd band limiter while the interstage variable band-elimination filter 34 does as the 3rd band limiter. The interstage variable band-elimination filter 34 may have the substantially same constitution as the variable band-elimination filter 24 shown in FIG. 5.

As mentioned above, this fourth embodiment makes use of the interstage variable band-pass filter 4 capable of varying its passing band and the interstage variable band-elimination filter 34 capable of varying its elimination band, so that even in the case the frequency fu causing the single-signal interference is intermixed within the receiving band, such an interference wave of the frequency fu can be attenuated to 30 dB by setting the passing band width of the variable band-pass filter 4 a little wider (e.g. 3 MHz) than the channel band width (1.23 MHz) and varying the passing band of this filter 4 so as to include the selected channel band width, and further the interference wave of the frequency fu can be attenuated to 30 dB by varying the elimination band of the variable band-elimination filter 34 so as to include the frequency fu. Accordingly, the endurance characteristic against the single-signal interference can be further improved, and the endurance characteristic against intermodulation interference can be also improved. Therefore, the present invention can be preferably used in the heavy electric field including various interference waves.

As has been discussed in detail, according to the high frequency receiving circuit of the invention, unnecessary waves outside the passing band of the 2nd band limiter, for instance such an interference wave of the frequency fu causing the single-signal interference, can be attenuated by varying the passing band of the band limiter, thus enabling the endurance characteristic against the single-signal interference and also the endurance characteristic against intermodulation interference to be improved.

Accordingly, the high frequency receiving circuit of the invention can be more effective comparing to the prior art double conversion type high frequency receiving circuit, that is, it can contribute to reducing the number of circuit elements, lowering the operational current consumption, and making the circuit more compact. Still further, the frequency control voltage of the local carrier wave generator can be used as the band control voltage, so that there is no need for any control device to be newly prepared and it becomes possible to apply the band control voltage to the 2nd band limiter by means of a simple circuit arrangement.

The entire disclosure of Japanese Patent Application No. JP 8-101033 filed on Apr. 23, 1996 including specification, claims, drawings and summary is incorporated herein by reference in its entirely.

What is claimed is:

1. A high frequency receiving circuit for a mobile and/or portable communication apparatus capable of receiving a desired signal within the band of a channel selected from a plurality of channels which are divided within a receiving band by means of frequency division based on selective channel information comprising:

a first band limiter which attenuates the component outside the receiving band of a receiving wave received through an antenna by a predetermined attenuation value with respect to the component within said receiving band;

a second band limiter which varies its passing band width to include said selected channel band and attenuates the component outside said passing band of the receiving wave outputted from said first band limiter by a predetermined attenuation value with respect to the component within said passing band;

a local carrier wave generator which generates, based on said selective channel information, a local carrier wave of which the frequency is different from the center frequency of said selected channel by an intermediate frequency as set in advance; and a frequency converter which mixes the receiving wave outputted from said second band limiter with said local carrier wave outputted from said local carrier wave generator, thereby converting the center frequency of said desired signal contained in said receiving wave to said intermediate frequency.

2. A high frequency receiving circuit as claimed in claim 1, wherein the passing band of said first band limiter is set a little wider than the channel band width.

3. A high frequency receiving circuit as claimed in claim 1, wherein the passing band of said second band limiter is wider than the channel band width but narrower than the receiving channel.

4. A high frequency receiving circuit as claimed in claim 1, wherein said local carrier wave generator generates a control signal for controlling the passing band of said second band limiter based on said selective channel information.

5. A high frequency receiving circuit as claimed in claim 1 further comprising a controller which generates a control signal for controlling the passing band of said second band limiter based on said selective channel information.

6. A high frequency receiving circuit as claimed in claim 5, wherein said controller outputs said selective channel information to said local carrier wave generator.

7. A high frequency receiving circuit as claimed in claim 5, wherein said controller is a D/A converter.

8. A high frequency receiving circuit as claimed in claim 1 further comprising a third band limiter which has a predetermined elimination band width and varies the center frequency of said elimination band, thereby attenuating the component within said elimination band of an input wave by a predetermined attenuation value with respect to the component outside said elimination band.

9. A high frequency receiving circuit as claimed in claim 8, wherein in case of setting the frequency of said local carrier wave on the high frequency side with respect to the center frequency of said selected channel, said elimination band is controlled so as to include a frequency which is a half of the intermediate frequency larger than the center frequency of said selected channel.

10. A high frequency receiving circuit as claimed in claim 8, wherein in case of setting the frequency of said local carrier wave on the lower frequency side with respect to the center frequency of said selected channel, said elimination band is controlled so as to include a frequency which is a half of the intermediate frequency lower than the center frequency of said selected channel.

11. A high frequency receiving circuit as claimed in claim 1, wherein said second band limiter comprises:
   a fourth band limiter which attenuates the component outside the receiving band of an input wave by a predetermined attenuation value with respect to the component within the receiving band of said input wave; and
   a fifth band limiter which has a predetermined elimination band width and varies the center frequency of said elimination band, thereby attenuating the component within the elimination band of said input wave by a predetermined attenuation value, with respect to the component outside said elimination band.

12. A high frequency receiving circuit as claimed in claim 11, wherein the passing band of said fourth band limiter is set a little wider than the channel band width.

13. A high frequency receiving circuit as claimed in claim 11, wherein in case of setting the frequency of said local carrier wave on the high frequency side with respect to the center frequency of said selected channel, said elimination band is controlled so as to include a frequency which is a half of the intermediate frequency larger than the center frequency of said selected channel.

14. A high frequency receiving circuit as claimed in claim 11, wherein in case of setting the frequency of said local carrier wave on the lower frequency side with respect to the center frequency of said selected channel, said elimination band is controlled so as to include a frequency which is a half of the intermediate frequency lower than the center frequency of said selected channel.

15. A high frequency receiving circuit as claimed in claim 1 which is applicable to a mobile and/or portable communication apparatus according to the CDMA system.

* * * * *